(12) United States Patent
Jagannathan et al.

(10) Patent No.: US 8,274,116 B2
(45) Date of Patent: Sep. 25, 2012

(54) CONTROL OF THRESHOLD VOLTAGES IN HIGH-K METAL GATE STACK AND STRUCTURES FOR CMOS DEVICES

(75) Inventors: Hemanth Jagannathan, Albany, NY (US); Takashi Ando, Yorktown Heights, NY (US); Vijay Narayanan, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 12/619,209

(22) Filed: Nov. 16, 2009

(65) Prior Publication Data

US 2011/0115026 A1    May 19, 2011

(51) Int. Cl.
*H01L 21/70* (2006.01)
(52) U.S. Cl. ......... 257/368; 257/369; 257/410; 257/411
(58) Field of Classification Search .................. 257/368, 257/369, 410, 411
See application file for complete search history.

(56) References Cited

U.S. PATENT DOCUMENTS

| | | | |
|---|---|---|---|
| 6,281,559 B1 | 8/2001 | Yu et al. | |
| 6,310,367 B1 | 10/2001 | Yagishita et al. | |
| 6,468,888 B1 | 10/2002 | Yu | |
| 6,780,741 B2 | 8/2004 | Chen et al. | |
| 6,828,181 B2 | 12/2004 | Chen et al. | |
| 6,861,712 B2 | 3/2005 | Gao et al. | |
| 6,894,357 B2 | 5/2005 | Guo | |
| 7,105,889 B2 | 9/2006 | Bojarczuk, Jr. et al. | |
| 7,145,167 B1 | 12/2006 | Chu | |
| 7,151,023 B1 | 12/2006 | Nayfeh et al. | |
| 7,226,832 B2 | 6/2007 | Yeo et al. | |
| 7,297,618 B1 | 11/2007 | Henson et al. | |
| 7,354,848 B2 | 4/2008 | Paranjpe et al. | |
| 7,728,387 B1* | 6/2010 | Krishnamohan et al. | 257/369 |
| 2001/0002709 A1 | 6/2001 | Wallace et al. | |
| 2002/0096994 A1 | 7/2002 | Iwafuchi et al. | |
| 2004/0043569 A1 | 3/2004 | Ahn et al. | |
| 2004/0142579 A1* | 7/2004 | Morita et al. | 438/785 |
| 2004/0256662 A1 | 12/2004 | Black et al. | |
| 2005/0161663 A1 | 7/2005 | Atanackovic | |
| 2005/0258468 A1 | 11/2005 | Colombo et al. | |
| 2006/0131675 A1* | 6/2006 | Wang et al. | 257/411 |
| 2006/0244035 A1 | 11/2006 | Bojarczuk, Jr. et al. | |

(Continued)

FOREIGN PATENT DOCUMENTS

EP    1833094 A1    9/2007

OTHER PUBLICATIONS

S. Jakschik, et al., "A 50nm high-k poly silicon gate stack with a buried SiGe channel", IEEE, 2007, 2 pages.

(Continued)

*Primary Examiner* — Tan N Tran
(74) *Attorney, Agent, or Firm* — Cantor Colburn LLP; Louis Percello

(57) ABSTRACT

A high-k metal gate stack and structures for CMOS devices and a method for forming the devices. The gate stack includes a germanium (Ge) material layer formed on the semiconductor substrate, a diffusion barrier layer formed on the Ge material layer, a high-k dielectric having a high dielectric constant greater than approximately 3.9 formed over the diffusion barrier layer, and a conductive electrode layer formed above the high-k dielectric layer.

3 Claims, 12 Drawing Sheets

U.S. PATENT DOCUMENTS

| | | | |
|---|---|---|---|
| 2006/0289948 | A1 | 12/2006 | Brown et al. |
| 2007/0045718 | A1 | 3/2007 | Bhattacharyya |
| 2007/0048919 | A1 | 3/2007 | Adetutu et al. |
| 2007/0057347 | A1 | 3/2007 | Ikeda |
| 2007/0090471 | A1 | 4/2007 | Cartier et al. |
| 2007/0132010 | A1 | 6/2007 | Bhattacharyya |
| 2008/0064156 | A1 | 3/2008 | Ikeda |
| 2008/0224238 | A1* | 9/2008 | Kanakasabapathy et al. ............ 257/411 |
| 2009/0302390 | A1 | 12/2009 | Van Dal et al. |
| 2010/0264495 | A1* | 10/2010 | Mo et al. ............ 257/369 |

OTHER PUBLICATIONS

H. Rusty Harris, et al., "Band-Engineered Low PMOS VT with High-K/Metal Gates Featured in a Dual Channel CMOS Integration Scheme", 2007 Symposium on VLSI Technology Digest of Technical Papers, pp. 154-155.

E. F. Crabbe et al., "Planar Fully-Integrated Bulk/SOI SiGe CMOS Fabrication Process" IBM Technical Disclosure Bulletin; Mar. 1992, pp. 128-129, vol. 34, No. 10A.

P.W. Liu et al., "SiGe Channel CMOSFETs Fabricated on (110) Surfaces with TaC/HfO2 Gate Stacks," VLSI-TSA, IEEE, 2007.

U.S. Appl. No. 12/477,536; Non-Final Office Action; Date Filed: Jun. 3, 2009; Date Mailed: May 13, 2011.

U.S. Appl. No. 12/477,536; Non-Final Office Action; Date Filed: Jun. 3, 2009; Date Mailed: Oct. 14, 2011.

U.S. Appl. No. 12/477,536; Final Office Action; Date Filed: Jun. 3, 2009; Date Mailed: Mar. 6, 2012; pp. 1-26.

* cited by examiner

CONTROL OF THRESHOLD VOLTAGES IN HIGH-K METAL GATE STACK AND STRUCTURES FOR CMOS DEVICES

BACKGROUND

The present invention relates to a semiconductor structure, and more specifically, to a semiconductor structure and method for obtaining tunable threshold voltages in high-k metal gate stacks and complementary metal oxide semiconductor (CMOS) devices.

The use of silicon germanium (SiGe) as the channel of a p-FET device has been shown to reduce the flatband and threshold voltage to the p-FET band edge. This shift in the flatband and threshold voltage has been associated with the band-gap modulation of SiGe with the incorporation of germanium (Ge). However, the voltage shifts that are obtained in semiconductor devices are not entirely consistent with the sole consideration of band-gap narrowing.

Further, there is an undesirable shift in the threshold voltage of an n-FET device which cannot be explained due to valence band off-set by the use of SiGe. The shift in the threshold voltage of the n-FET device may be related to the presence of germanium (Ge) near the high-k dielectric and in its subsequent incorporation in the n-FET gate stack.

SUMMARY

The present invention obviates the above-mentioned problems by providing a material stack that incorporates a diffusion barrier layer between the germanium (Ge) material layer and the high-k dielectric to prevent the incorporation and the subsequent shift in the threshold voltage of the n-FET device.

According to one embodiment of the present invention, a material stack formed on a semiconductor substrate of a semiconductor structure is provided. The material stack includes a germanium (Ge) material layer formed on the semiconductor substrate, a diffusion barrier layer formed on the Ge material layer, a high-k dielectric having a high dielectric constant greater than approximately 3.9 formed over the diffusion barrier layer, and a conductive electrode layer formed above the high-k dielectric layer.

According to yet another embodiment of the present invention, a semiconductor structure is provided. The semiconductor structure includes a first semiconductor device having a first patterned material stack disposed on a semiconductor substrate, and a second semiconductor substrate having a second patterned material stack disposed on the semiconductor substrate. The first patterned material stack and the second patterned material stack each include a germanium (Ge) material layer formed on the semiconductor substrate, a high-k dielectric having a high dielectric constant greater than approximately 3.9 formed over the Ge material layer, and a conductive electrode layer formed above the high-k dielectric layer. The first patterned material stack includes a diffusion barrier layer disposed between the high-k dielectric and the Ge material layer.

According to another embodiment of the present invention, a method of forming a semiconductor structure on a semiconductor substrate is provided. The semiconductor structure having a first semiconductor device including a first patterned material stack and a second semiconductor device including a second patterned material stack. The method includes forming a germanium (Ge) material layer on the semiconductor substrate, forming a diffusion barrier layer on the Ge material layer only in the first patterned material stack, forming a high-k dielectric having a dielectric constant greater than approximately 3.9, forming a metal oxide or nitride layer in the first patterned material stack interfacing with the high-k dielectric, and forming a conductive electrode layer above the high-k dielectric.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
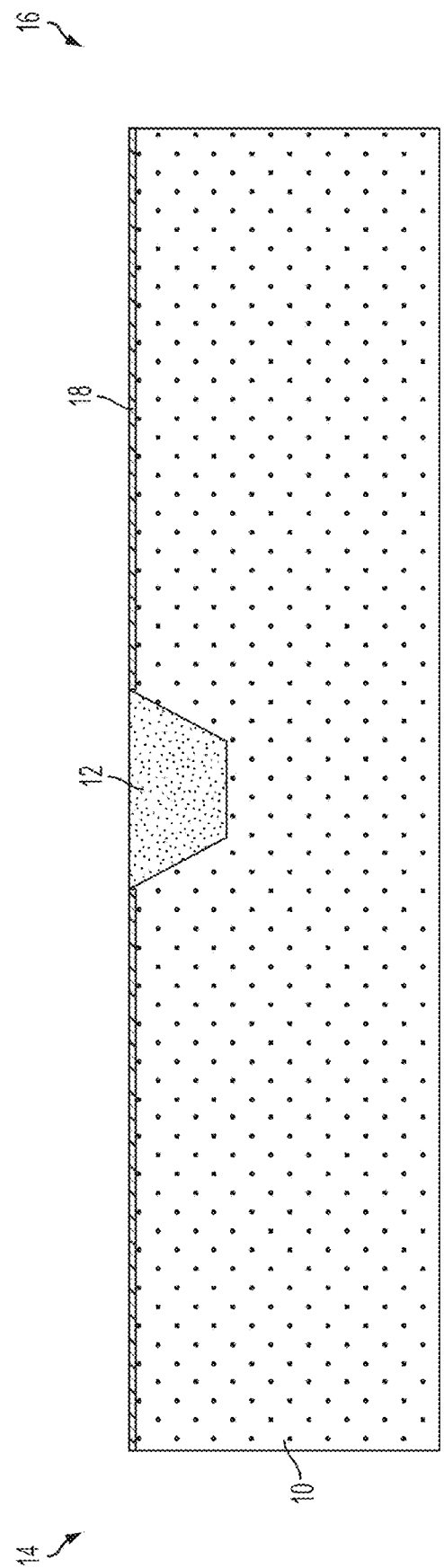
FIG. 1 is a cross-sectional view of a pictorial representation illustrating a deposition operation of a material layer for forming a material stack that can be implemented within embodiments of the present invention.

Reference is made to FIGS. 1-11 which are pictorial representations of basic fabrication steps that may be used to form the material stack on the surface of a semiconductor substrate according to an embodiment of the present invention. With reference now to FIG. 1, a semiconductor substrate 10 including a semiconducting material such as silicon (Si) is formed and includes at least one isolation region 12. According to an embodiment of the present invention, the isolation region 12 may be a shallow trench isolation (STI) region formed by lithography, etching and filling of the trench with a trench dielectric, for example. The isolation region 12 provides isolation between adjacent semiconductor device components e.g., a n-type field effect transistor (n-FET) device 14 and a p-type field effect transistor (p-FET) device 16 as shown in FIG. 1. After processing the semiconductor substrate 10, an interface preparation (not shown) may be performed on the surface of the semiconductor substrate 10 to prepare for the subsequent germanium (Ge) containing material layer deposition.

Further in FIG. 1, a germanium (Ge) containing material layer 18 is formed on the surface of the semiconductor substrate 10. According to an embodiment of the present invention, the Ge material layer 18 includes germanium and any compounds thereof. For example, according to one embodiment of the present invention, silicon germanium (SiGe) is formed by an epitaxy (EPI) process. The fraction of germanium within the Ge material layer 18 may be up to 100% (pure Ge film) with 30-60% being preferred. According to an embodiment of the present invention, the Ge material layer 18 includes a thickness which is less than or equal to approximately 50 nanometers (nm) with a range of 10-20 nanometers (nm) being preferred. The Ge material layer 18 may be deposited utilizing a deposition process such as diffusion, co-deposition, chemical vapor deposition (CVD), physical vapor deposition (PVD), molecular beam epitaxy (MBE), plasma-enhanced chemical vapor deposition (PECVD), atomic layer deposition (ALD), evaporation, sputtering or implantation, for example. After processing the Ge material layer on the semiconductor substrate 10, an optional interface preparation layer e.g., a chemical oxidation (chemox) layer (not shown) may be formed on the surface of the semiconductor substrate 10. This optional layer prepares the surface of the semiconductor substrate 10 for a dielectric layer (to be described below) with reference to FIG. 6.

Figure 2:
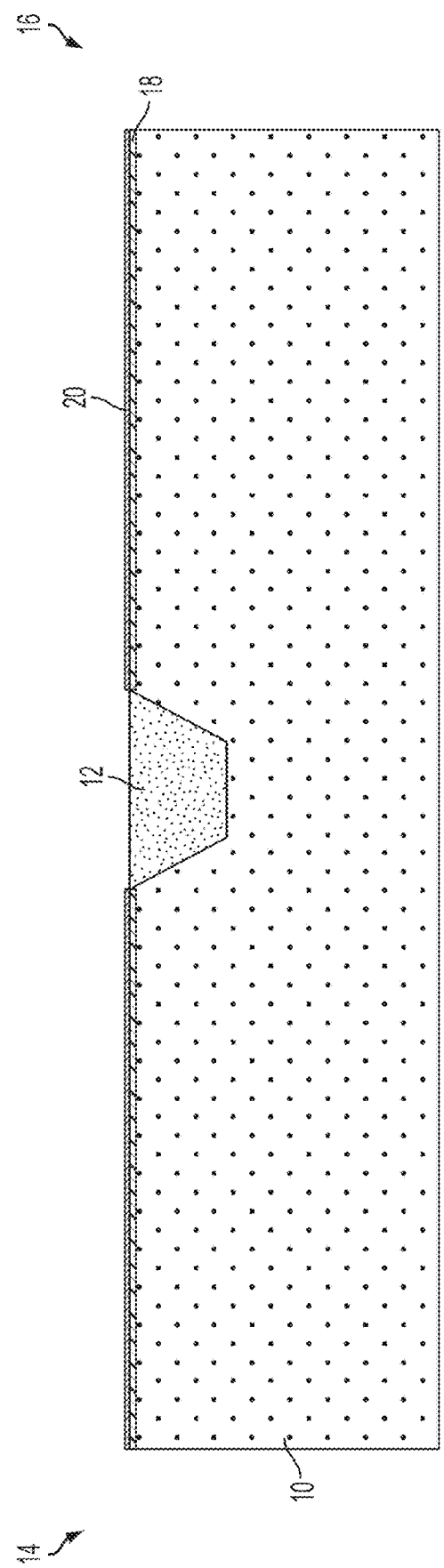
FIG. 2 is a cross-sectional view of a pictorial representation illustrating a deposition operation of a diffusion barrier layer for forming a material stack that can be implemented within embodiments of the present invention.
Figure 3:
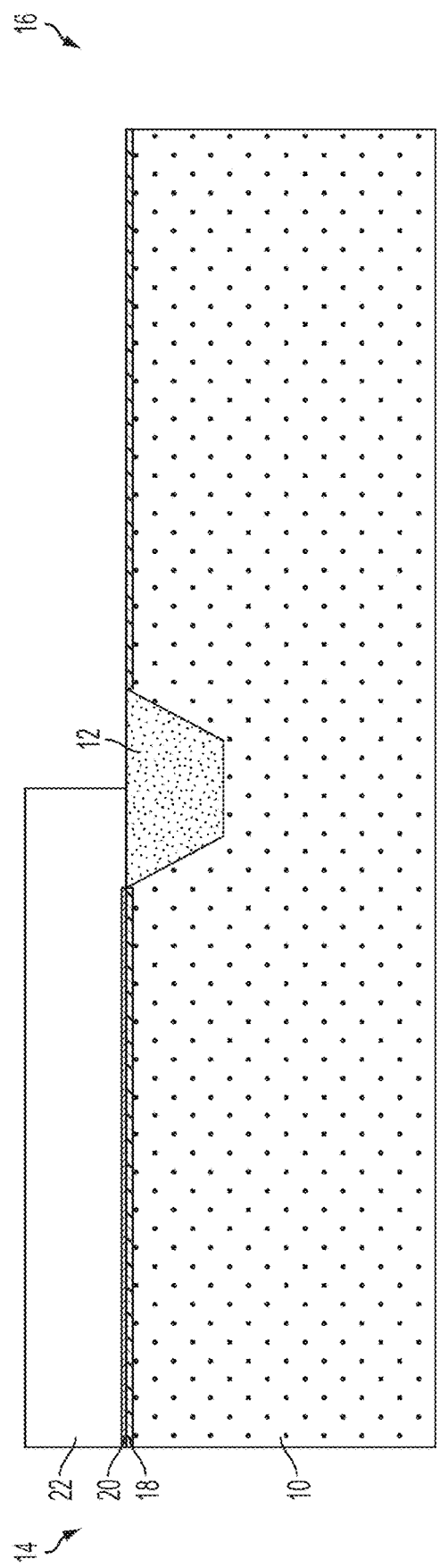
FIG. 3 is a cross-sectional view of a pictorial representation illustrating a removal operation of the diffusion barrier layer from a p-FET device shown in FIG. 2 that can be implemented within embodiments of the present invention.

FIGS. 2 and 3 illustrate a method of forming a diffusion barrier layer on the n-FET device 14 of a semiconductor structure according to an embodiment of the present invention.

In FIG. 2, according to one embodiment of the present invention, a diffusion barrier layer 20 is deposited on the Ge material layer 18 on both the n-FET device 14 and the p-FET device 16. The diffusion barrier layer 20 is formed using a direct plasma nitridation (DPN) or rapid thermal anneal (RTA)/Ammonia (NH3) process, for example.

In FIG. 3, a photo resist layer 22 is formed on the n-FET device 14 and, after patterning of the photo resist layer 22, the diffusion barrier layer 20 is selectively removed from the p-FET device 16 using a diluted hydrofluoric (DHF) or buffered hydrofluoric (BHF) etching process, for example. After the diffusion barrier layer 20 is removed from the p-FET device 16, the remaining photo resist layer 22 is removed from the n-FET device 14. Accordingly, the diffusion barrier layer 20 remains on the n-FET device 14. According to an embodiment of the present invention, the diffusion barrier layer 20 prevents diffusion of the Ge material layer 18 (to be discussed below with reference to FIG. 12).

Figure 4:
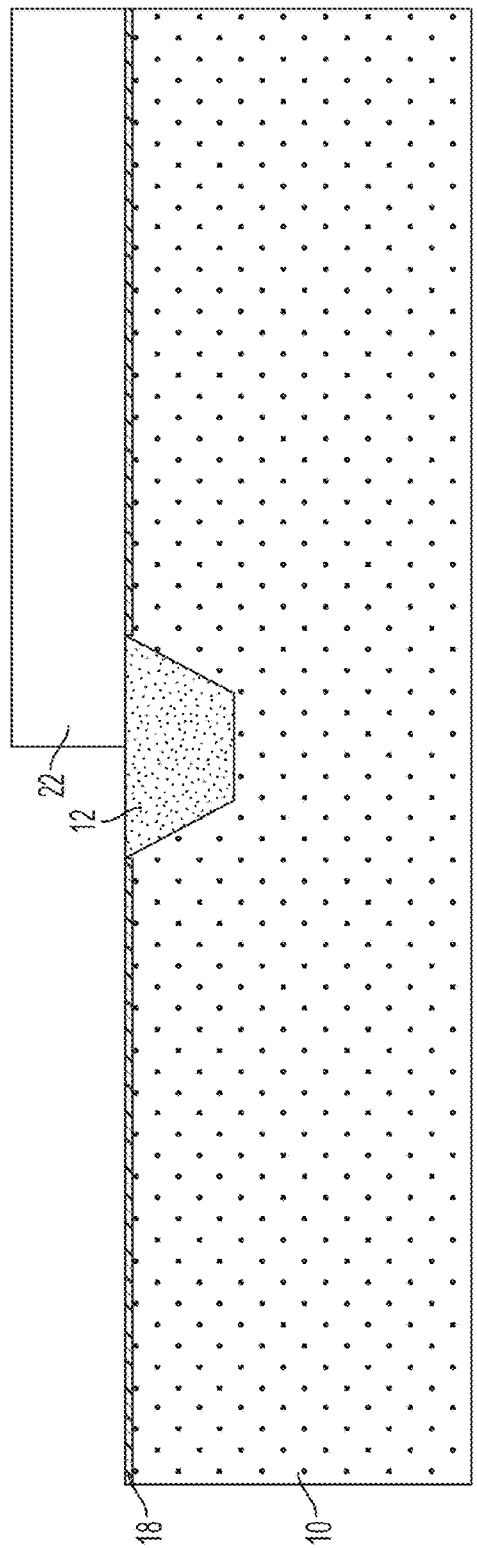
FIG. 4 is a cross-sectional view of a pictorial representation illustrating a blocking operation of a p-FET device that can be implemented within alternative embodiments of the present invention.
Figure 5:
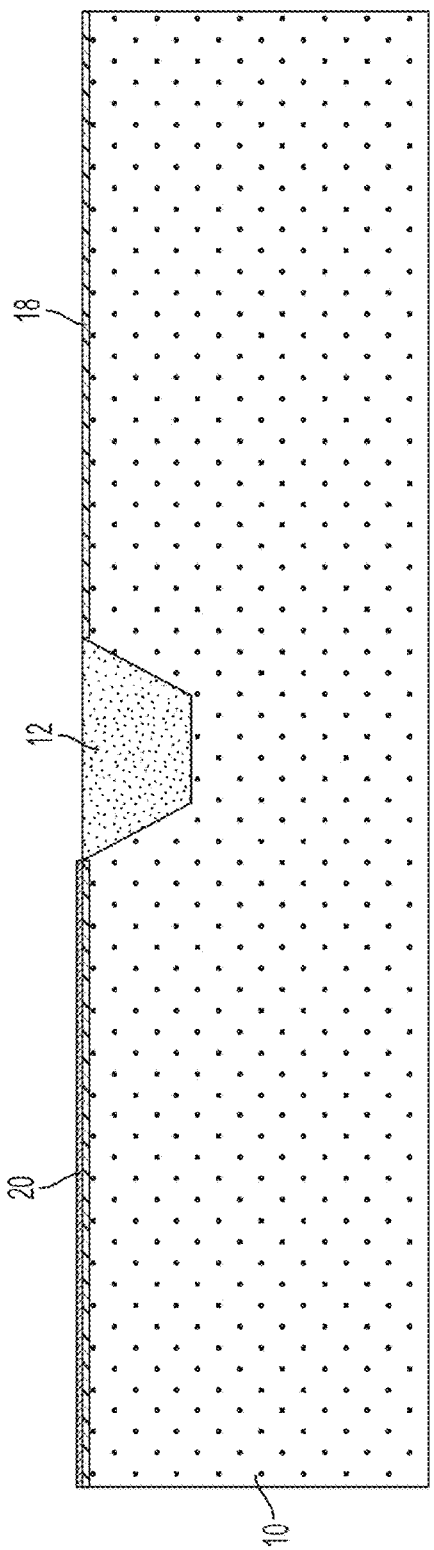
FIG. 5 is a cross-sectional view of a pictorial representation illustrating a deposition operation of a diffusion barrier layer only on an n-FET device that can be implemented within alternative embodiments of the present invention.

FIGS. 4 and 5 are diagrams illustrating an operation for forming the diffusion barrier layer on the n-FET device 14 that can be implemented within alternative embodiments of the present invention.

Referring now to FIG. 4, a masking layer such as a photo resist layer 22, for example is formed, patterned and selectively removed such that it remains only on the p-FET device 16. Next, in FIG. 5, the diffusion barrier layer 20 is formed only on the n-FET device 14 (since the photo resist layer 22 effectively blocks formation of the diffusion barrier layer 20 on the p-FET device 16), with the photo resist layer 22 being thereafter removed from the p-FET device 16.

Figure 6:
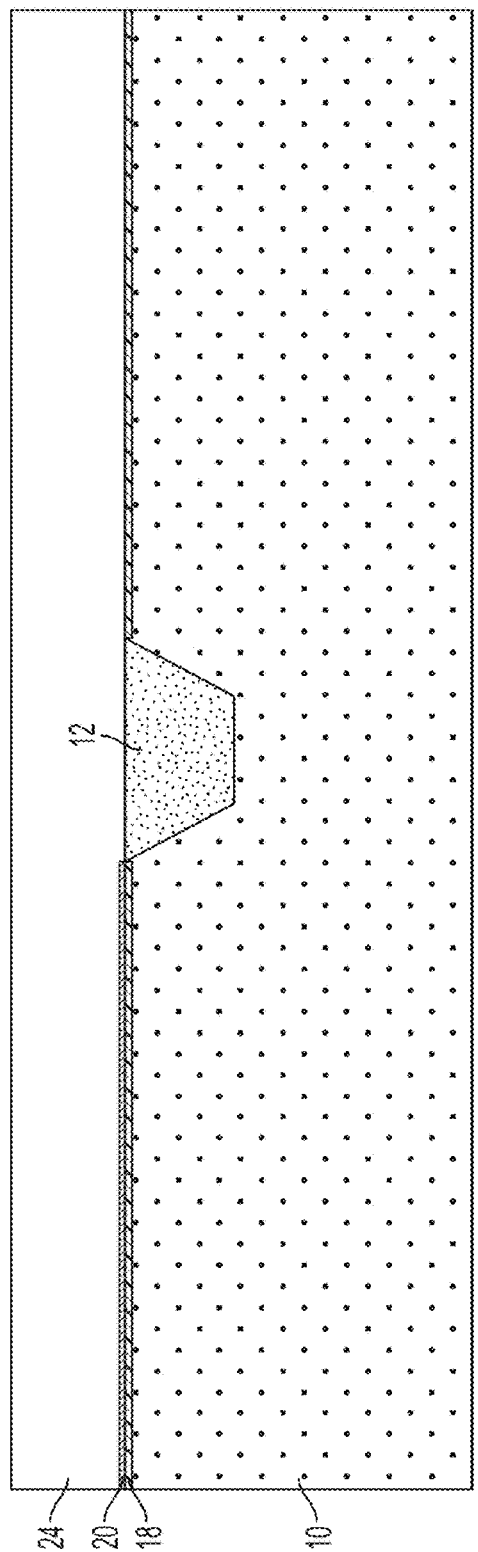
FIG. 6 is a cross-sectional view of a pictorial representation illustrating a deposition operation of a high-k dielectric material for forming a material stack that can be implemented within embodiments of the present invention.

Regardless of how the diffusion barrier layer 20 is selectively formed over the n-FET device 14, in FIG. 6, a "high-k" dielectric layer 24 (that is, a material having a high dielectric constant ($\kappa$) greater than approximately 3.9) is formed on the surface of the diffusion barrier layer 20 on the n-FET device 14 and on the Ge material layer 18 on the p-FET device 16. The high-k dielectric layer 24 is formed, for example, by a deposition process such as CVD, PVD, ALD, evaporation, reactive sputtering, or other like deposition processes. According to an embodiment of the present invention, the thickness of the high-k dielectric layer 24 ranges from approximately 0.5 nanometers (nm) to approximately 3 nanometers (nm), for example.

Figure 7:
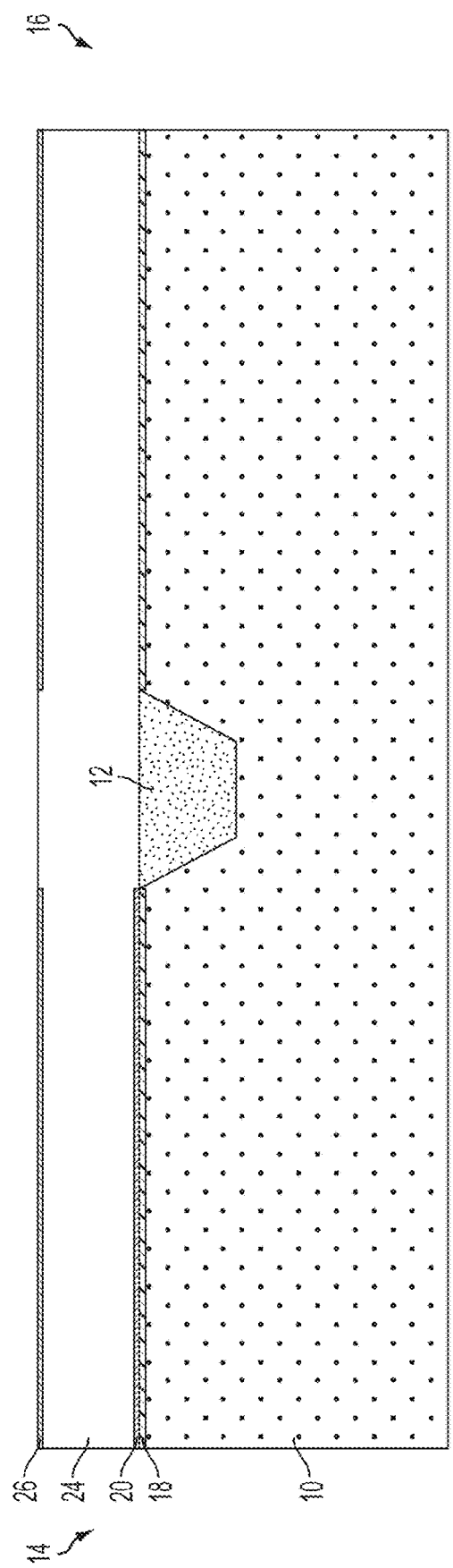
FIG. 7 is a cross-sectional view of a pictorial representation illustrating a deposition operation of a metal oxide or nitride layer that can be implemented within embodiments of the present invention.

Once the structure shown in FIG. 6 is formed, a metal oxide or nitride layer 26 is formed over the high-k dielectric layer 24 in FIG. 7. The metal oxide or nitride layer 26 may include an alkaline or a rare earth metal-containing material such as in Group IIA or IIIB as further discussed in Patent Publication No. 2006-0244035 entitled "Stabilization of Flatband Voltages and Threshold Voltages in Hafnium Oxide based Silicon Transistors for CMOS" filed on Apr. 29, 2005, written by Bojarczuk Jr. et al. and Patent Publication No. 2006-02889948 entitled "Method to control Flatband/Threshold voltages in High-K Metal Gated Stack and Structures Thereof", filed on Jun. 22, 2005 written by Brown et al., both of which are incorporated by reference herein in their entirety. According to one embodiment, the metal oxide or nitride layer 26 is used for the purpose of tuning the threshold voltage at the n-FET device 14.

Figure 8:
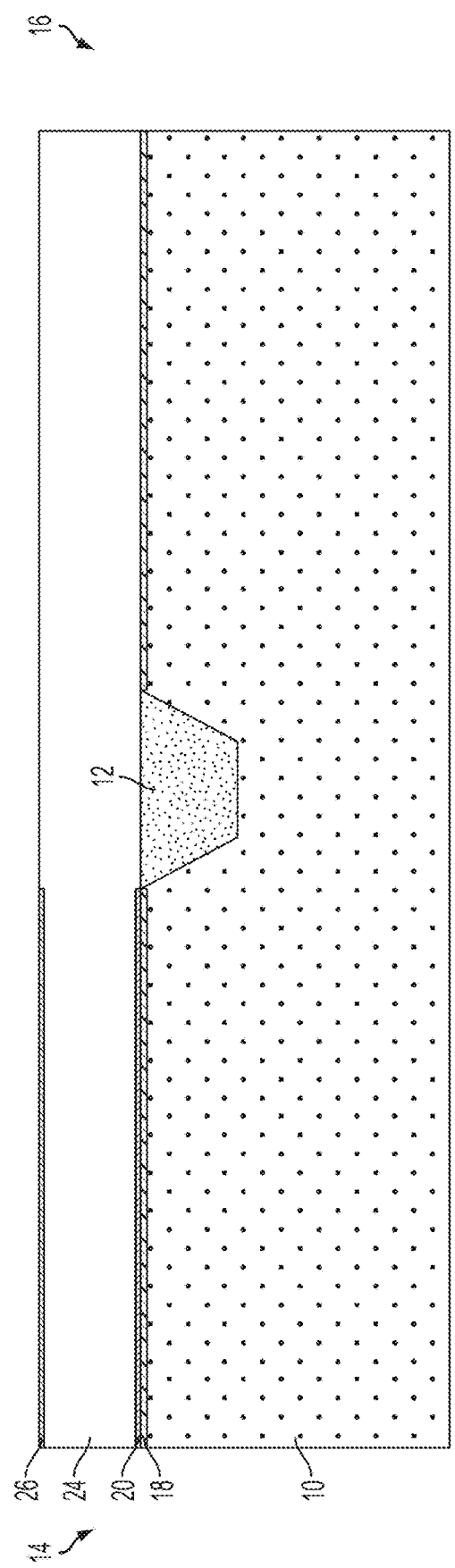
FIG. 8 is a cross-sectional view of a pictorial representation illustrating a removal operation of the metal oxide or nitride layer shown in FIG. 7 from the p-FET structure that can be implemented within embodiments of the present invention.

Thus, according to one embodiment, the metal oxide or nitride layer 26 is selectively removed from the p-FET device 16 in FIG. 8. Patterning is performed using a masking layer such as a photo resist layer to remain on the n-FET regions and the p-FET regions are exposed. Dry or wet etching is used to remove the metal oxide or nitride layer 26 from the p-FET device 16. However, the present invention is not limited hereto and may vary as necessary.

Figure 9:
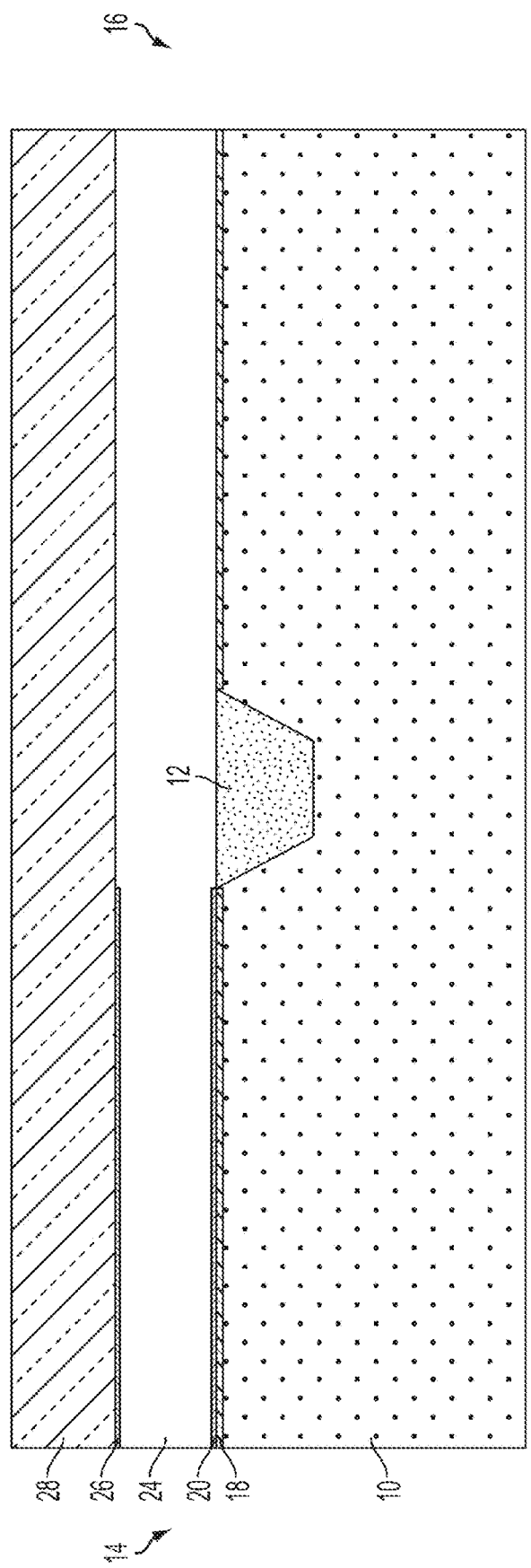
FIG. 9 is a cross-sectional view of a pictorial representation illustrating a deposition operation of a conductive electrode layer that can be implemented within embodiments of the present invention.

Next, in FIG. 9, a conductive electrode layer 28 is formed on the surface of the metal oxide or nitride layer 26 on the n-FET device 14 and directly on the high-k dielectric layer 24 formed on the p-FET device 16. The conductive electrode layer 28 includes metallic material. The conductive electrode layer 28 is formed, for example, by a deposition process such as CVD, PVD, ALD, sputtering or evaporation. According to an embodiment of the present invention, the conductive electrode layer 28 may be formed of a single metal layer or dual metal layers and may vary from the n-FET device 14 and the p-FET device 16. This is accomplished by performing deposition and selective etching of the different devices 14, 16.

Figure 10:
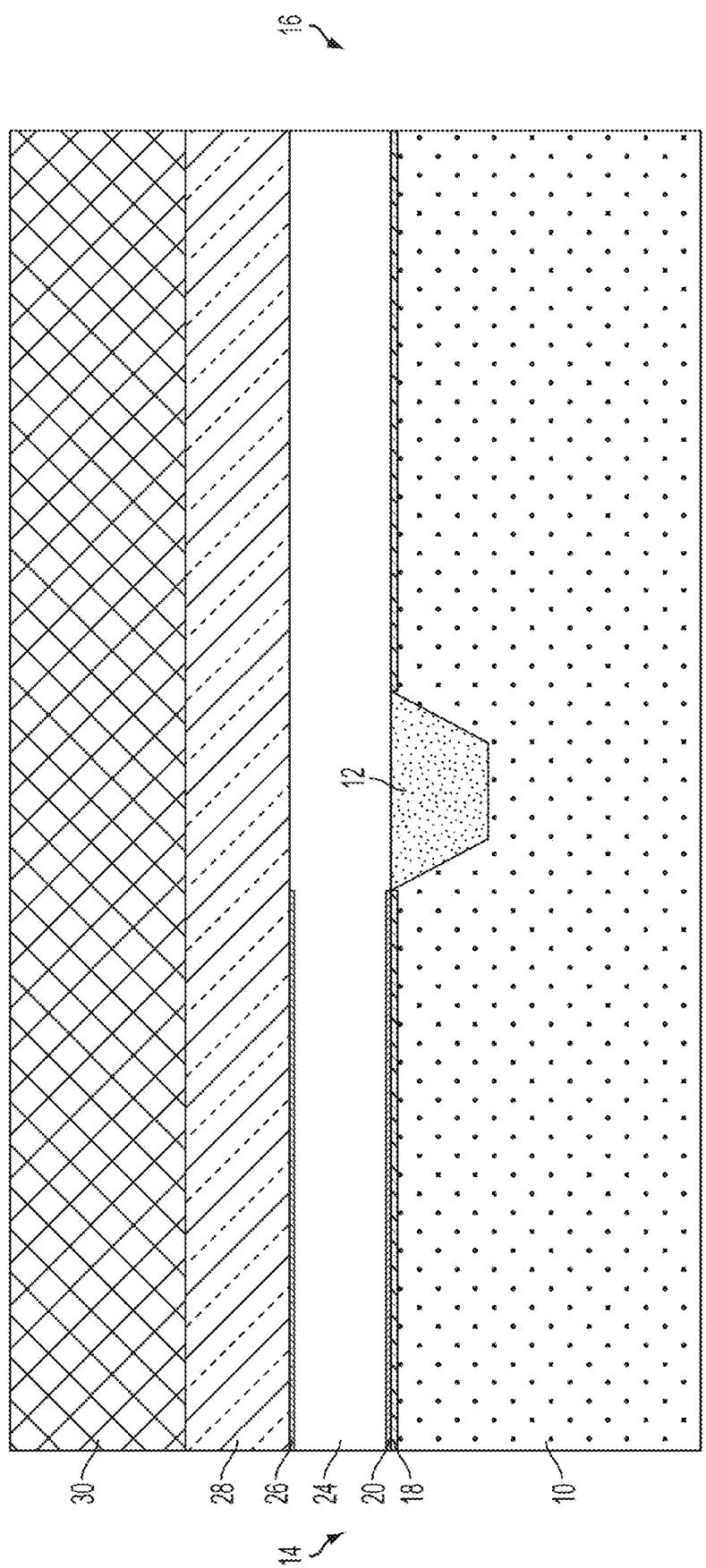
FIG. 10 is a cross-sectional view of a pictorial representation illustrating a deposition operation of a conductive layer that can be implemented within embodiments of the present invention.

Following the formation of the conductive electrode layer 28 as shown in FIG. 9, according to one embodiment as shown in FIG. 10, a conductive layer 30 is formed using a deposition process such as CVD, PVD or evaporation. The conductive layer 30 may include a Si-containing conductor or a metallic conductive layer such as polysilicon.

Figure 11:
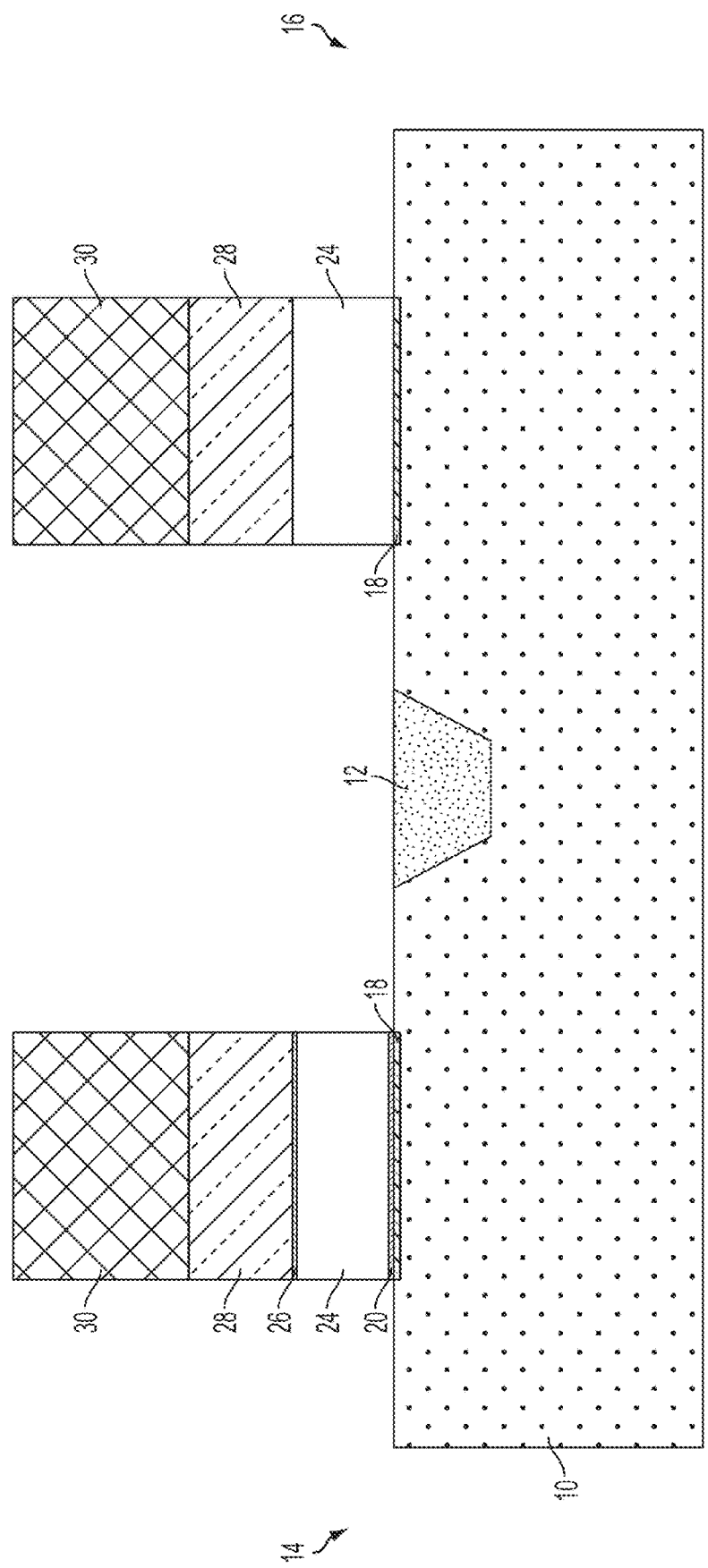
FIG. 11 is a cross-sectional view of a pictorial representation illustrating an etching operation for forming the material stack that can be implemented within embodiments of the present invention.

In FIG. 11, the resulting gate stack structure is fabricated into a CMOS structure. As shown, the gate stack structure is patterned by etching to define gates for the n-FET device 14 and the p-FET device 16. According to an embodiment of the present invention, a first patterned material stack formed on the n-FET device 14 includes a Ge material layer 18 and a diffusion barrier layer 20 beneath the high-k dielectric layer 24 and a metal oxide or nitride layer 26 on top of the high-k dielectric layer 24. Therefore, the diffusion barrier layer 20 is disposed between the Ge material layer 18 and the high-k dielectric layer 24. A second patterned material stack formed on the p-FET device 16 includes the Ge material layer 18 formed beneath the high-k dielectric layer 24.

Further in FIG. 11, in the first patterned material stack formed on the n-FET device 14, the conductive electrode layer 28 is formed on the metal oxide or nitride layer 26 and the optional conductive layer 30 may be formed on the conductive electrode layer 28. Further, in the second patterned material stack formed on the p-FET device 16, the conductive electrode layer 28 is formed directly on the high-k dielectric layer 24 and the optional conductive layer 30 may be formed on the conductive electrode layer 28.

According to an embodiment of the present invention, there are several alternative embodiments for the first and second patterned material stacks. For example, the use of different conductive electrodes on the n-FET and p-FET devices, the use of additional p-FET threshold shifting layers on the p-FET device 16 that are selectively patterned, the positioning the n-FET and/or p-FET threshold voltage shifting layers above or below the high-k dielectric or optionally patterning of the threshold voltage shifting layers.

Figure 12:
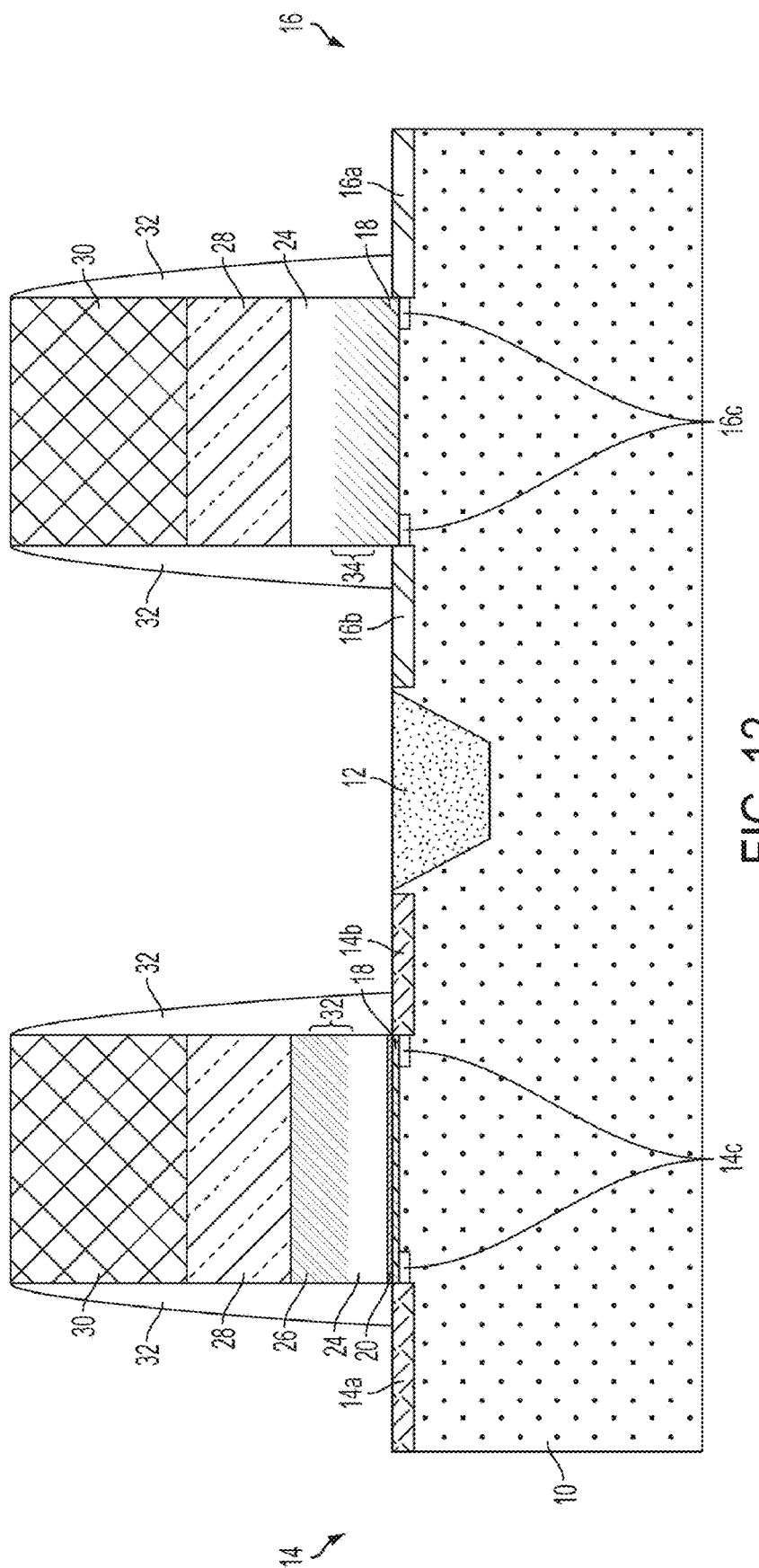
FIG. 12 is a cross-sectional view of a pictorial representation illustrating an ion implantation and activation operation for an n-FET and p-FET device as shown in FIG. 11 that can be implemented within embodiments of the present invention.

An ion implantation and annealing process for the gate stack structure shown in FIG. 12 as a part of the subsequent transistor fabrication. As shown in FIG. 12, diffusion regions 32 and 34 are formed within the gate stack structure as a result of the ion implantation and annealing processes. As shown in FIG. 12, the diffusion region 32 shown at the gate stack of the n-FET device 14 is formed when the metal oxide or nitride layer 24 disposed above the high-k dielectric layer 24 moves down into the high-k dielectric layer 24, and the diffusion region 34 shown at the gate stack of the p-FET device 16 is formed when the Ge material layer 20 disposed below the high-k dielectric layer 24 moves up into the high-k dielectric layer 24. Further, source regions 14a and 16a and drain regions 14b and 16b are formed on the n-FET device 14 and the p-FET device 16, respectively. In addition, extension regions 14c and 16c are formed respectively at the n-FET device 14 and the p-FET device 16. Further, spacers 32 surround the respective gate stacks. According to an embodiment of the present invention, the diffusion barrier layer 20 formed on the n-FET device 14 prevents diffusion of the Ge material layer 18 formed on the n-FET device 14 into the high-k dielectric layer 24 formed on the n-FET device 14, therefore preventing n-FET voltage shift.

Embodiments of the present invention provide germanium (Ge) in the channel of both n-FET and p-FET devices of a CMOS structure and a diffusion barrier layer in the n-FET device. Thus, the present invention provides the advantages of not requiring selective silicon germanium (SiGe) deposition, mitigating the threshold voltage shift due to SiGe on the n-FET using the diffusion barrier layer, providing higher electron and hole mobility channels without compromising on threshold voltage and an overall simplified integration scheme.

Further, the presence of the material stack according to embodiments of the present invention may be determined by analytical techniques such as secondary ion mass spectroscopy (SIMS), electron energy loss spectroscopy (EELS), medium energy ion scattering (MEIS), X-ray photoelectron spectroscopy (XPS), and Rutherford back scattering (RBS).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow of the diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
   an n-type field effect transistor having a first patterned material stack disposed on a semiconductor substrate; and
   a p-type field effect transistor having a second patterned material stack disposed on the semiconductor substrate, the first patterned material stack and the second patterned material stack, each comprising:
   a germanium (Ge) material layer formed on the semiconductor substrate;
   a high-k dielectric having a high dielectric constant greater than approximately 3.9 formed over the Ge material layer; and
   a conductive electrode layer formed above the high-k dielectric layer, and
   wherein only the first patterned material stack additionally comprises a diffusion barrier layer formed between the high-k dielectric and the Ge material layer.

2. The semiconductor structure of claim 1, wherein the first patterned material stack further comprises a metal oxide or nitride layer formed over the high-k dielectric.

3. The semiconductor structure of claim 2, wherein the metal oxide or nitride layer comprises at least one of an alkaline or a rare earth metal-containing material.

* * * * *